(12) United States Patent
Yamaji et al.

(10) Patent No.: US 7,233,382 B2
(45) Date of Patent: Jun. 19, 2007

(54) LCD CONNECTED TO ADDITIONAL LCD THROUGH MULTIPLE FLEXIBLE PRINTED CIRCUIT BOARDS

(75) Inventors: Yasuhisa Yamaji, Yamatokoriyama (JP); Yasunori Chikawa, Kitakatsuragi-gun (JP); Tsukasa Ohishi, Kawachinagano (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/793,007

(22) Filed: Mar. 5, 2004

(65) Prior Publication Data
US 2004/0189926 A1  Sep. 30, 2004

(30) Foreign Application Priority Data
Mar. 24, 2003  (JP)  ............ 2003-080877

(51) Int. Cl.
*G02F 1/1345*  (2006.01)
(52) U.S. Cl. ........................ 349/150; 349/152
(58) Field of Classification Search ........ 349/149–152; 345/1.1, 1.3, 3.1
See application file for complete search history.

(56) References Cited

U.S. PATENT DOCUMENTS

| | | | |
|---|---|---|---|
| 5,959,709 A * | 9/1999 | Asada et al. ............. | 349/150 |
| 6,184,965 B1 * | 2/2001 | Murayama et al. ......... | 349/150 |
| 6,229,514 B1 * | 5/2001 | Larson ..................... | 345/101 |
| 6,618,044 B1 * | 9/2003 | Gettemy et al. ............. | 345/204 |
| 6,839,046 B1 | 1/2005 | Orisaka et al. | |
| 6,954,184 B2 * | 10/2005 | Kurashima et al. .......... | 345/1.3 |
| 2004/0021616 A1 | 2/2004 | Goto et al. | |

FOREIGN PATENT DOCUMENTS

JP  2001-215475  8/2001

OTHER PUBLICATIONS

TW 552451 dated Sep. 11, 2003 (U.S. counterpart 6,839,046 listed above).
JP 2004-61892 dated Feb. 26, 2004 (U.S. counterpart US 2004/0021616 listed above).

* cited by examiner

*Primary Examiner*—Andrew Schechter
*Assistant Examiner*—Phu Vu
(74) *Attorney, Agent, or Firm*—Nixon & Vanderhye P.C.

(57) ABSTRACT

This invention is to provide a liquid crystal module that enables a liquid crystal display (LCD) device to be further miniaturized. The liquid crystal module is configured to include at least two LCD devices and formed separately from each other, a first flexible substrate on which a semiconductor chip for driving the LCD devices and is mounted, and a second flexible substrate wherein signal transmission wiring is formed. One of the LCD devices and is electrically connected to the first flexible substrate, the other one of the LCD devices and is electrically connected to the second flexible substrate, and the first flexible substrate is electrically connected to the second flexible substrate.

6 Claims, 9 Drawing Sheets

LCD CONNECTED TO ADDITIONAL LCD THROUGH MULTIPLE FLEXIBLE PRINTED CIRCUIT BOARDS

BACKGROUND OF THE INVENTION

1. Field of the Invention

The invention relates to a liquid crystal module including a structure of flexible substrates (which are each called a "tape carrier") on which, for example, semiconductor chips and passive components for driving liquid crystal display (LCD) devices are mounted, and LCD devices.

2. Description of Related Art

With widespread use of cellular mobile phones in recent few years, rapid progress has been achieved in the aspect of their functionality with high added value or significant benefits. In addition to the aspects of software functions, such as motion-picture playback functions and Internet connection functions, significant advance has been accomplished also in the aspects of hardware functions such as those of camera functions. Among these functions, mainstreams are not only main LCD devices mainly for using, for example, conventional telephone functions and Internet functions, but also are cellular mobile phones concurrently having a subordinate LCD device for use of, for example, incoming-information guide display of mail, telephone, and the like data, communication status display, and residual battery capacity display.

Conventionally, the main LCD device and the subordinate LCD device are constituted as independent devices. As liquid crystal modules electrically connected to mutually different flexible substrates on which eigen liquid crystal drivers are mounted, the independent LCD devices are mounted in a single package in such a manner that their rear faces are mutually opposite and are driven independently of each other to perform display.

This technique requires two different liquid crystal drivers, namely, a liquid crystal driver for driving the main LCD device and a liquid crystal driver for driving the subordinate LCD device. Generally, the main LCD device and the subordinate LCD device are stored back to back in a package of a cellular mobile phone, there takes place a thinning limit.

By way of an improved technique for the above, FIGS. 8 and 9 show a liquid crystal module conventionally proposed. The module is configured to include a liquid crystal driver 4 formed by incorporating the functions of two liquid crystal drivers, and an end portion of a flexible substrate 3a on which the liquid crystal driver 4 is mounted and a main LCD device 1 are electrically connected together. On the side opposite a connection section of the main LCD device 1, the main LCD device 1 and a subordinate LCD device 2 are electrically connected together via a flexible substrate 7 formed only of wiring. The module is thus configured to aim for reducing the number of components and reducing the thickness. Another proposed liquid crystal module is configured to include a main LCD device and a subordinate LCD device on a common liquid crystal glass plate in lieu of the flexible substrate 7, and wiring is formed on the glass plate. In this configuration, the power is supplied from a terminal portion (not shown) of the flexible substrate 3a on which the liquid crystal driver is mounted, which terminal is formed on the side opposite an end portion of connection with the main LCD device 1.

In the conventional liquid crystal module, while segment wiring 5a is shared between the main LCD device 1 and the subordinate LCD device 2, common wiring 5b is not shared therebetween. As such, the common wiring is formed in two end portions on base glass 1b of the main LCD device 1, and is connected to the subordinate LCD device 2 via the flexible substrate 7 that connects between the main LCD device 1 and the subordinate LCD device 2.

As such, problems arise in that the configuration requires an edge region for forming the common wiring of the subordinate LCD device in two end portions of the base glass of the main LCD device, so that further miniaturization of the main LCD device is restrained. (Refer to Japanese Unexamined Patent Publication No. 2001-215475).

SUMMARY OF THE INVENTION

The present invention is made in view of the problems described above, and an object of the invention is to provide a liquid crystal module that enables a liquid crystal display (LCD) device to be further miniaturized.

According to one aspect of the invention, a liquid crystal module comprises at least two LCD devices formed separately from each other, a first flexible substrate on which a semiconductor chip for driving the LCD devices is mounted, and a second flexible substrate wherein signal transmission wiring is formed. One of the LCD devices is electrically connected to the first flexible substrate, the other one of the LCD devices is electrically connected to the second flexible substrate, and the first flexible substrate is electrically connected to the second flexible substrate.

More specifically, the first flexible substrate on which the semiconductor chip is mounted is unidirectionally directly connected to the second flexible substrate to which the other one of the LCD device is connected. Therefore, common wiring dedicated for the other one of the LCD devices need not be formed in two end portions of base glass of one of the main LCD devices. As such, an edge region of the one of the LCD devices can be formed narrow to thereby implement further miniaturization.

Further, it is preferable that an LCD device connection portion for connecting with one of the LCD devices be provided in one edge portion of the first flexible substrate, and a power connection portion to which a power supply line for supplying the power to the semiconductor chip is electrically connected be provided in the other edge portion of the first flexible substrate. According to this configuration, when the module is mounted in a cellular mobile phone so that a display section can be viewed from both sides of a package of the phone, the second flexible substrate can be bent in the form of the letter U in a cross-sectional view. This enables the power to be entered via a power terminal section formed on an end portion opposite a connection portion of the first flexible substrate for connecting with the one of the main LCD devices, consequently enabling compact wiring to be implemented within a limited mounted region.

DETAILED DESCRIPTION OF THE INVENTION

A liquid crystal module according to the first embodiment of the invention will be described hereunder with reference to the drawings.

Figure 1:
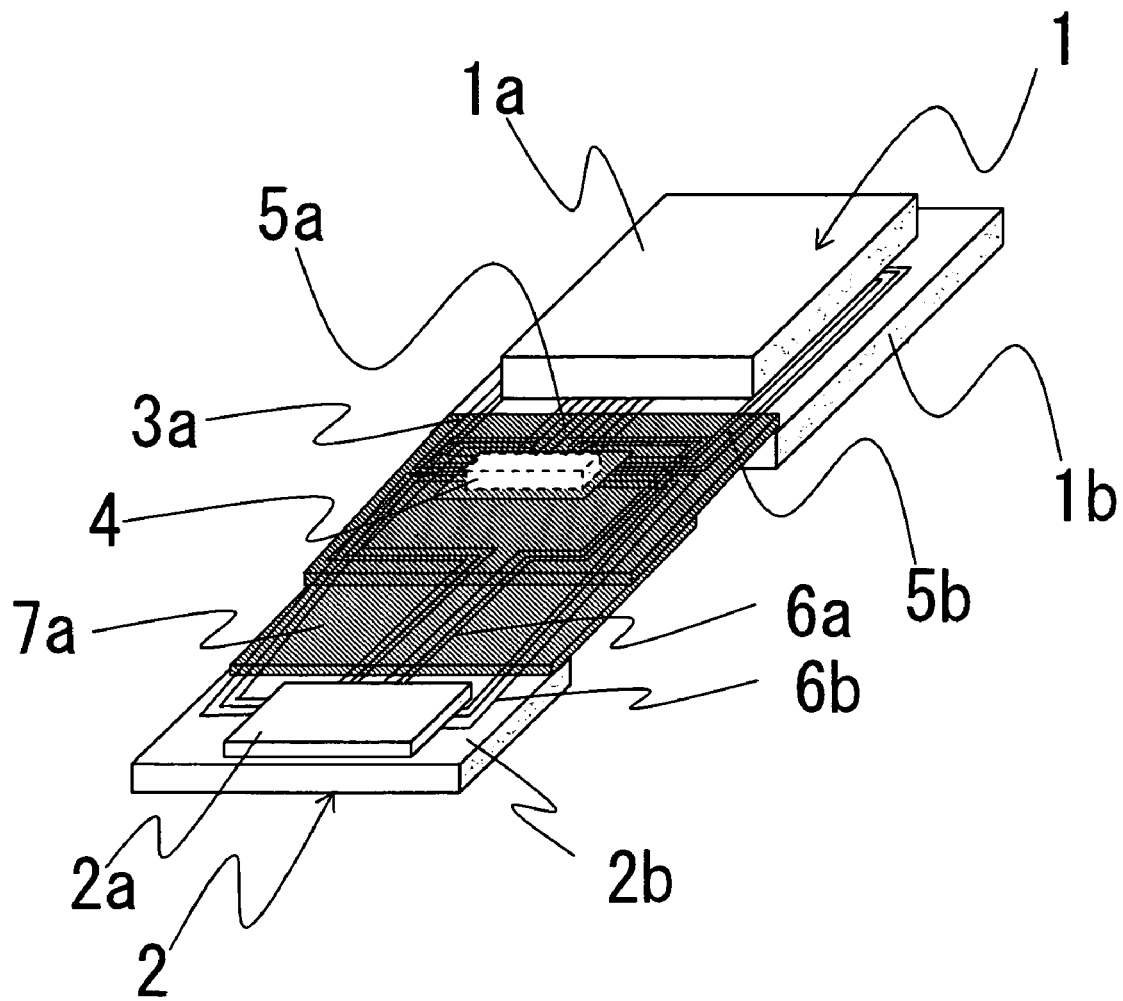
FIG. 1 is a view showing an embodiment of a liquid crystal module according to the invention.
Figure 2:
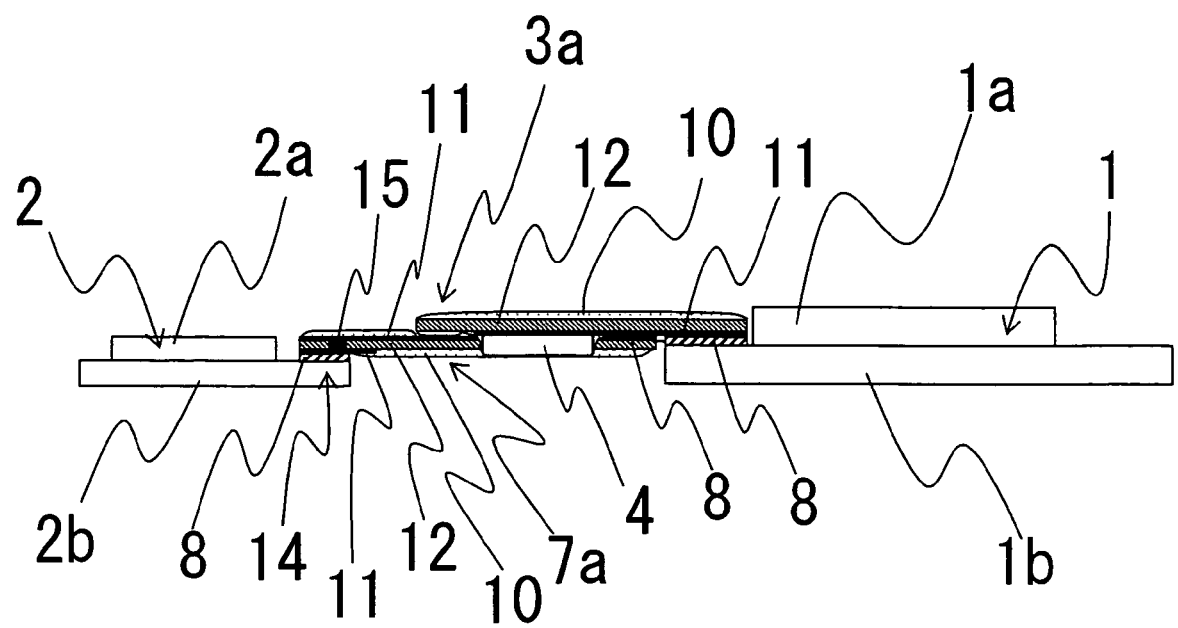
FIG. 2 is a view showing a cross sectional structure of the embodiment of the liquid crystal module according to the invention.

Referring to FIGS. 1 and 2, the liquid crystal module has a configuration including a main liquid crystal display (LCD) device 1 and a subordinate LCD device 2 formed such that liquid crystal is hermetically filled between respective upper glass plates 1a and 2a and respective base glass plates 1b and 2b. The configuration includes a single-sided wiring flexible substrate 3a as a first flexible substrate on which a liquid crystal driver 4 is mounted as a common semiconductor chip for driving the LCD devices 1 and 2, and a double-sided wiring flexible substrate 7a as a second flexible substrate having patterns of signal transmission wiring formed on both sides thereof. In one edge portion of the single-sided wiring flexible substrate 3a, driving common wiring 5b of the main LCD device 1 and segment wiring 5a thereof which are led out from the liquid crystal driver 4 are directly electrically connected via a conductive adhesive 8 such as an ACF (anisotropic conductive film) to a pattern of wiring formed on the base glass plate 1b of the main LCD device 1. Additionally, the single-sided wiring flexible substrate 3a is electrically connected to the subordinate LCD device 2 via the double-sided wiring flexible substrate 7a.

Wiring 11 formed on both sides of a base material 12 of the double-sided wiring flexible substrate 7a is electrically connected with driving common wiring 6b of the subordinate LCD device 2 and segment wiring 6a thereof, which are led out from the liquid crystal driver 4 mounted on the single-sided wiring flexible substrate 3a, via the conductive adhesive 8 in a peripheral position of the liquid crystal driver 4. In this configuration, the driving common wiring 6b and the segment wiring 6a, which are formed on one side of the double-sided wiring flexible substrate 7a, are electrically connected with wiring formed on the other side thereof via a through-hole 15 so-called a "via." In addition, the common wiring 6b and the segment wiring 6a, which are led out from the liquid crystal driver 4, are electrically connected with a pattern of wiring formed on the base glass plate 2b of the subordinate LCD device 2, which is disposed opposite the main LCD device 1 with respect to the liquid crystal driver 4, via the conductive adhesive 8 in a connection portion 14 formed on an edge portion of the base glass plate.

Figure 3:
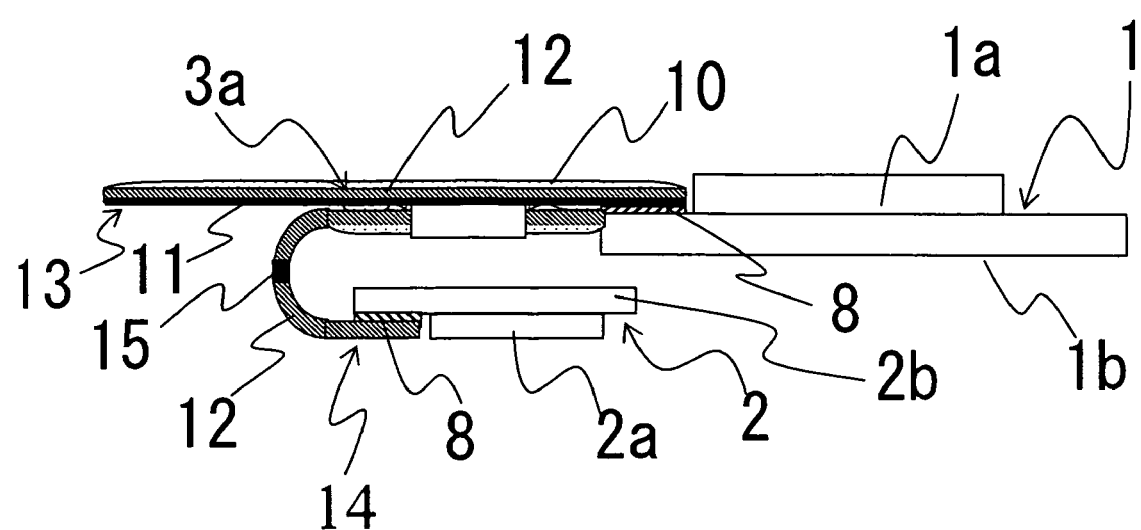
FIG. 3 is a view showing a cross sectional structure of another embodiment of a liquid crystal module according to the invention.

In the configuration described above, two screens of the main LCD device 1 and the subordinate LCD device 2 can be driven by the single common liquid crystal driver 4. As such, common wiring dedicated for the subordinate LCD device 2 need not be formed on the base glass of the main LCD device 1, consequently enabling miniaturization of a panel. In addition, as is shown in FIG. 3, the configuration is arranged such that when the module is mounted in the cellular mobile phone so that a display section can be viewed from both sides of the package of the phone, the double-sided wiring flexible substrate 7a can be mounted in a bent state. This enables the power to be entered via a power terminal section 13 formed on an end portion opposite the connection portion of the single-sided wiring flexible substrate 3a for connecting with the main LCD device 1, therefore enabling compact wiring to be implemented within a limited mounted region. In the drawing, numeral 10 denotes a solder-resist; numeral 12 denotes a base film; and the same numerals denote the same portions in a plurality of embodiments described below.

In summary, according to the embodiment described above, the liquid crystal module is configured of at least the two LCD devices formed separately from each other, the first flexible substrate on which the semiconductor chip for driving the LCD devices is mounted, and the second flexible substrate in which the signal transmission wiring is formed. One of the LCD devices is electrically connected to the first flexible substrate, the other one of the LCD devices is electrically connected to the second flexible substrate, and the first flexible substrate is electrically connected to the second flexible substrate. The first flexible substrate is formed of the single-sided wiring substrate having wiring formed on one side thereof, the second flexible substrate is formed of the double-sided wiring substrate having wiring formed on both sides thereof, the first flexible substrate is electrically connected to one side of the second flexible substrate, and the other one of the LCD devices is electrically connected to the other side thereof.

A second embodiment of a liquid crystal module according to the invention will be described hereinbelow with reference to the drawings.

Figure 4:
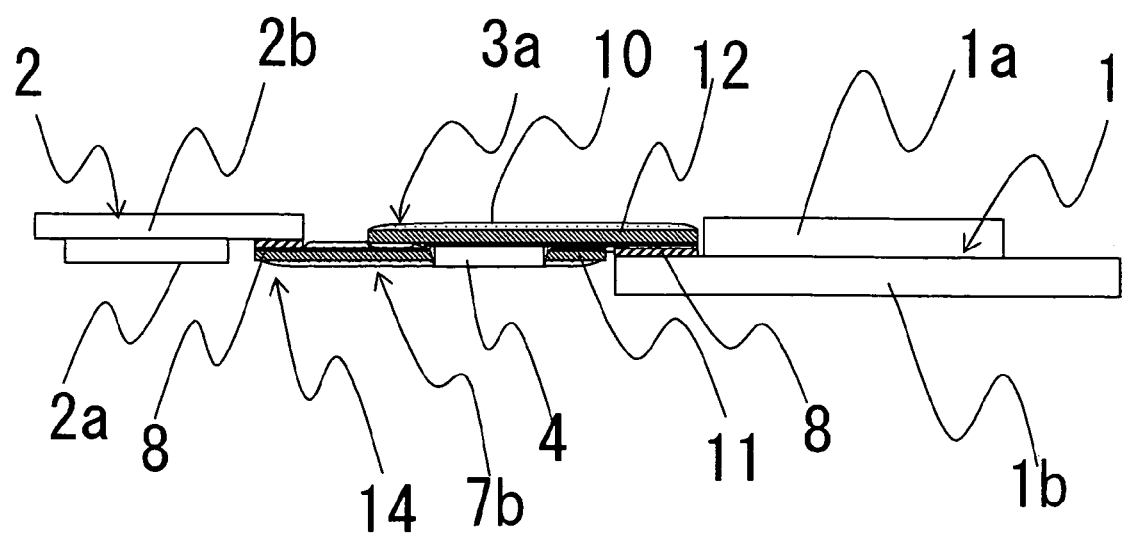
FIG. 4 is a view showing a cross sectional structure of another embodiment of a liquid crystal module according to the invention.

As shown in FIG. 4, in one edge portion of a single-sided wiring flexible substrate 3a, provided as the first flexible substrate on which a liquid crystal driver 4 for commonly driving a main LCD device 1 and a subordinate LCD device 2 is mounted, the main LCD device 1 is electrically connected via a conductive adhesive 8 such as an ACF. Additionally, the single-sided wiring flexible substrate 3a is electrically connected to a subordinate LCD device 2 via a single-sided wiring flexible substrate 7b provided as the second flexible substrate having wiring formed on one side thereof.

Wiring 11 formed on one side of a base film 12 of the single-sided wiring flexible substrate 7b is electrically connected with the driving common wiring of the subordinate LCD device 2 and the segment wiring thereof which are led out from the liquid crystal driver 4 mounted on the single-sided wiring flexible substrate 3a via the conductive adhesive 8 in a peripheral position of the liquid crystal driver 4. In addition, the wiring is electrically connected with wiring pattern formed on the base glass plate 2b of the subordinate LCD device 2, which is disposed opposite the main LCD device 1 with respect to the liquid crystal driver 4, via the conductive adhesive 8 in a connection portion 14 formed in an edge portion of the base glass plate. Assume for the purpose of example that, as in the first embodiment, the single-sided wiring flexible substrate 7b is mounted in the bent state in, for example, a package of a cellular mobile phone employing a conventional LCD device incapable of display beyond single-sided display. In this case, the display screen faces inwardly, so that the display is not viewable from an external position. To solve this problem, the present embodiment uses the LCD device capable of double-sided display for the subordinate LCD device 2.

Similarly to the first embodiment, the single-sided wiring flexible substrate 7b and the single-sided wiring flexible substrate 3a are electrically connected in the connection portion on the light hand side of the mounted position of the semiconductor chip. According to this configuration, with the single-sided wiring flexible substrate 7b being bent, the power can be entered via a power terminal section formed in left end portion of the single-sided wiring flexible substrate 3a.

In summary, the liquid crystal module is configured to include at least the two LCD devices configured separately from each other, the first flexible substrate on which the semiconductor chip for driving the LCD devices is mounted, and the second flexible substrate in which the signal transmission wiring is formed. One of the LCD devices is electrically connected to the first flexible substrate, the other one of the LCD devices is electrically connected to the second flexible substrate, and the first flexible substrate is electrically connected to the second flexible substrate. Both the first flexible substrate and the second flexible substrate are formed of the single-sided wiring substrate having wiring formed on one side thereof, and the other one of the LCD devices electrically connected to the second flexible substrate is formed of the panel capable of performing double-sided display.

A third embodiment of a liquid crystal module according to the invention will be described hereinbelow with reference to the drawings.

Figure 5:
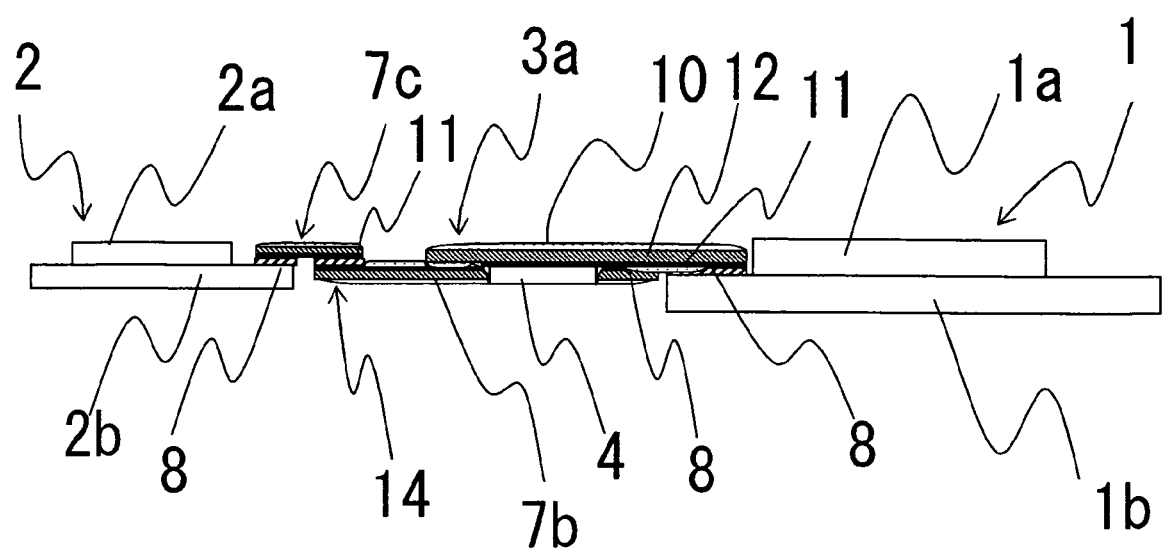
FIG. 5 is a view showing a cross sectional structure of another embodiment of a liquid crystal module according to the invention.

As shown in FIG. 5, a single-sided wiring flexible substrate 3a, provided as the first flexible substrate on which a liquid crystal driver 4 for commonly driving a main LCD device 1 and a subordinate LCD device is mounted is directly electrically connected with the main LCD device 1 via a conductive adhesive 8 such as an ACF. Additionally, the single-sided wiring flexible substrate 3a is electrically connected to the subordinate LCD device 2 via two flexible substrates 7b and 7c provided as second flexible substrates having wiring formed on one side thereof.

Wiring 11 formed on one side of a base film 12 of the single-sided wiring flexible substrate 7b is electrically connected with the driving common wiring of the subordinate LCD device 2 and the segment wiring thereof, which are led out from the liquid crystal driver 4 mounted on the single-sided wiring flexible substrate 3a, via the conductive adhesive 8. In the present embodiment also, as in the first embodiment, the configuration is arranged such that, for example, the single-sided wiring flexible substrate 7b can be mounted in the bent state in, for example, a package of a cellular mobile phone. Different from the case of the second embodiment, a display panel of a single-sided display type can be used for the subordinate LCD device 2.

In summary, the liquid crystal module is configured to include at least the two LCD devices formed separately from each other, the first flexible substrate on which the semiconductor chip for driving the LCD devices is mounted, and the second flexible substrate in which the signal transmission wiring is formed. One of the LCD devices is electrically connected to the first flexible substrate, the other one of the LCD devices is electrically connected to the second flexible substrate, and the first flexible substrate is electrically connected to the second flexible substrate, and the first flexible substrate and the second flexible substrate are electrically connected together. Both the first flexible substrate and the second flexible substrate are formed of the single-sided wiring substrate having wiring formed on one side thereof.

A fourth embodiment of a liquid crystal module according to the invention will be described hereinbelow with reference to the drawings.

Figure 6:
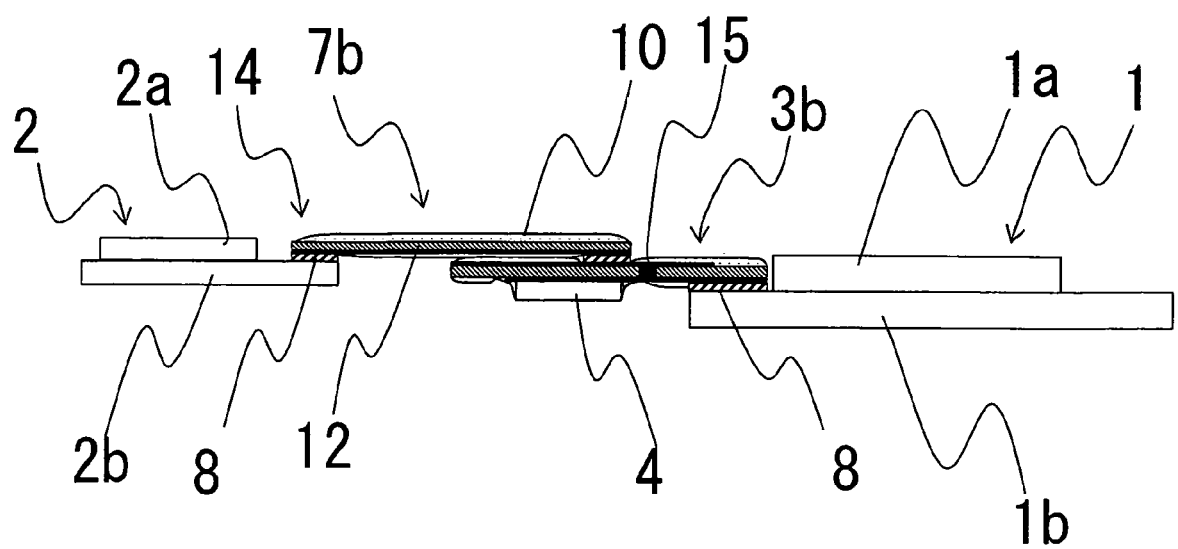
FIG. 6 is a view showing a cross sectional structure of another embodiment of a liquid crystal module according to the invention.

As shown in FIG. 6, a double-sided wiring flexible substrate 3b, provided as the first flexible substrate on which a liquid crystal driver 4 for commonly driving a main LCD device 1 and a subordinate LCD device 2 is mounted is directly electrically connected with the main LCD device 1 via a conductive adhesive 8 such as an ACF. Additionally, the double-sided wiring flexible substrate 3b is electrically connected to the subordinate LCD device 2 via a single-sided wiring flexible substrate 7b provided as the second flexible substrate having wiring formed on one side thereof.

Patterns of wiring formed on both sides of the double-sided wiring flexible substrate 3b are electrically connected via a through-hole 15, which is called a "via." Driving common wiring of the subordinate LCD device 2 and segment wiring thereof, which are led out from the liquid crystal driver 4, are extended to the reverse side through the through-hole 15, and are electrically connected to the subordinate LCD device 2 via the single-sided wiring flexible substrate 7b.

In summary, the liquid crystal module is configured to include at least the two LCD devices formed separately from each other, the first flexible substrate on which the semiconductor chip for driving the LCD devices is mounted, and the second flexible substrate in which the signal transmission wiring is formed. One of the LCD devices is electrically connected to the first flexible substrate, the other one of the LCD devices is electrically connected to the second flexible substrate, and the first flexible substrate is electrically connected to the second flexible substrate. The first flexible substrate is formed of the double-sided wiring substrate having wiring formed on both sides thereof, the second flexible substrate is formed of the single-sided wiring substrate having wiring formed on one side thereof, the other one of the LCD devices is electrically connected to one side of the first flexible substrate, and the second flexible substrate is electrically connected to the other side thereof.

Figure 7:
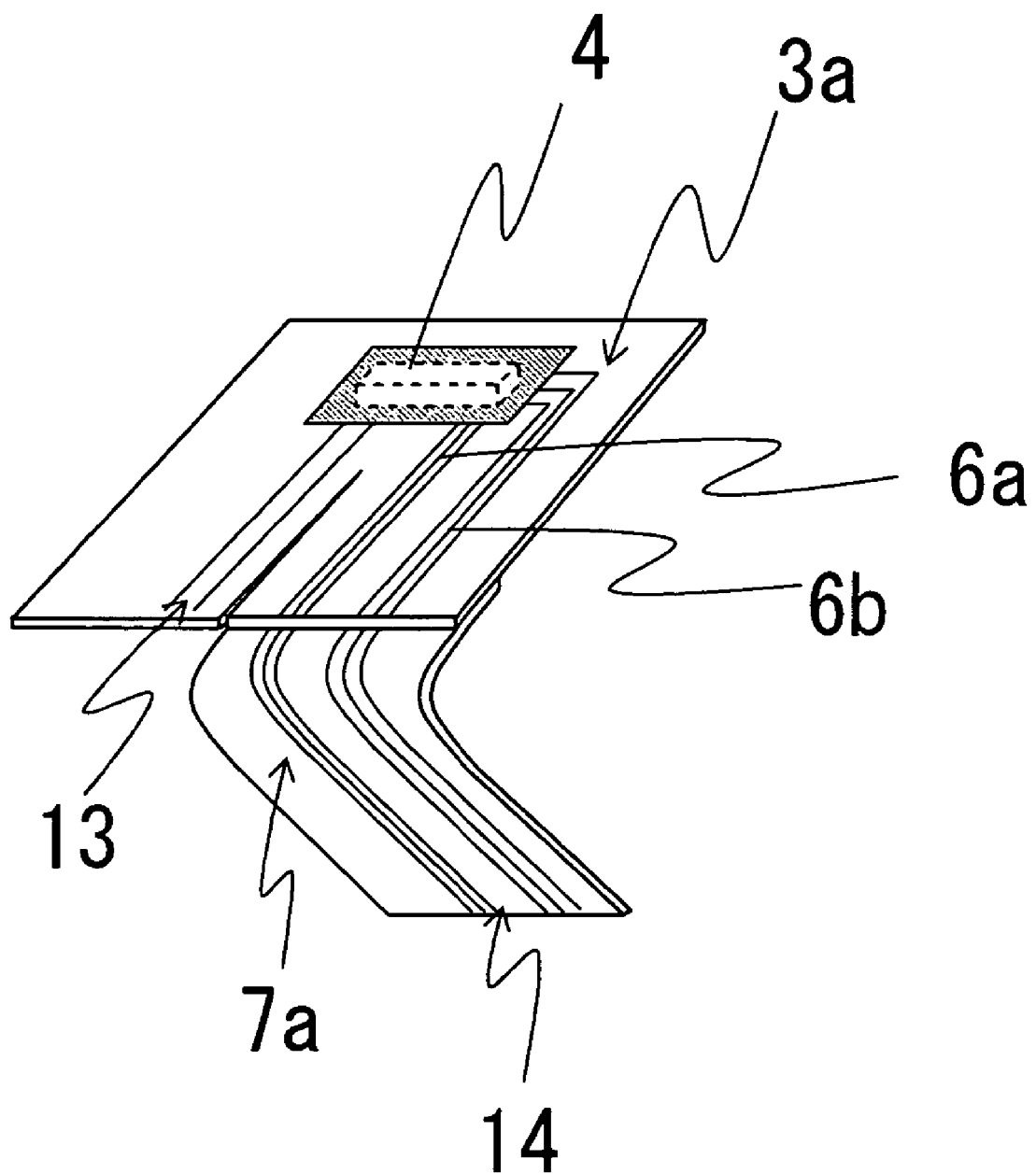
FIG. 7 is a view showing another embodiment of a liquid crystal module according to the invention.
Figure 8:
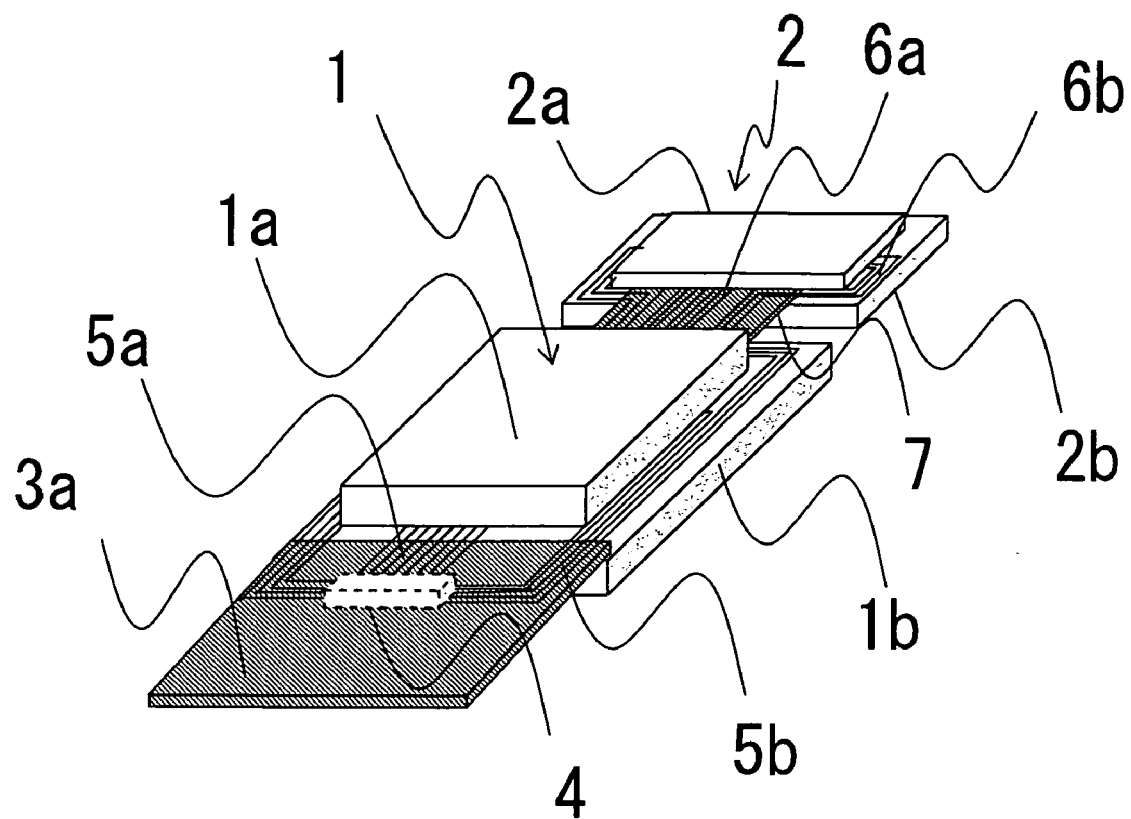
FIG. 8 is a view showing a conventional liquid crystal module.
Figure 9:
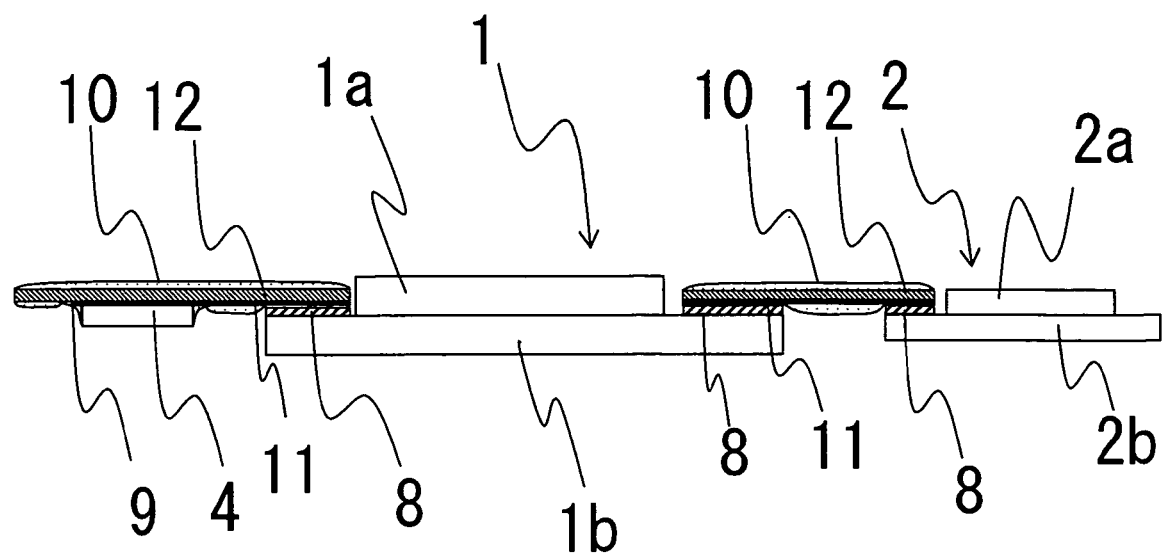
FIG. 9 is a view showing a cross sectional structure of the conventional liquid crystal module.

In any one of the embodiments described above, description has been provided with reference to the case described hereunder to implement compact wiring in a limited mounting region when display needs to be performed on both sides of the package. The case is that the LCD-device connection portion for connecting with one of the LCD devices is provided in one edge portion of the first flexible substrate, and the power connection portion to which a power supply line for supplying the power to the semiconductor chip is electrically connected in the other edge portion of the first flexible substrate. However, as shown in FIG. 7, the configuration may be as described hereunder. A cutout is formed to separate the other edge portion of the first flexible substrate 3a into two separated portions in the direction of the width thereof. One of the separated portions is formed to be a power connection portion 13, and the other separated portion is formed to be a connection portion 14 for connecting with the double-sided wiring flexible substrate 7a. Thereby, in the embodiment shown in FIG. 6, even in the case of mounting the module to enable viewing from both sides of the package, the power connection portion can easily be formed by bending the second flexible substrate 7b in the form of the letter U in a cross-sectional view.

Similarly, in the case of configuring the liquid crystal module constituted of at least the two LCD devices formed separately from each other and the first flexible substrate on which the semiconductor chip for driving the LCD devices is mounted, the configuration may be as described hereunder. One of the LCD devices and the other one of the LCD devices are separately disposed with the first flexible substrate interposed therebetween and are electrically connected together in individual edge portions thereof. A cutout is formed in one of the edge portions of the first flexible substrate for separation into two separated portions. One of the separated portions is formed to be a power connection portion, and the other separated portion is formed to be a connection portion for connecting with the LCD device. In this configuration also, the power connection portion can easily be formed by bending the first flexible substrate in the form of the letter U in a cross-sectional view even in the case of mounting the module to enable viewing from both sides of the package.

In any one of the embodiments described above, the subordinate LCD device 2 can be formed of the double-side displayable panel. In this case, the flexible substrate need not be mounted in the bent state, so that an electronic device enabling viewing from both sides of the package can be configured to be of a thin type.

In addition, as a matter of course, in any one of the embodiments described above, the first LCD device can be configured to be a subordinate LCD device, and also the second LCD device to be a main LCD device.

According to the present invention, it is possible to provide the liquid crystal module with which the LCD device can be even more miniaturized; and in addition, for a cellular mobile phone having the subordinate LCD device, while sharing the main LCD device and the liquid crystal driver, even more thinning and miniaturization can be accomplished.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A liquid crystal module comprising:
   at least two liquid crystal display (LCD) devices formed separately from each other, each of the two liquid crystal display devices comprising first and second spaced apart glass substrates sandwiching liquid crystal material therebetween;
   a first flexible substrate on which a semiconductor chip for driving the LCD devices is mounted; and
   a second flexible substrate where signal transmission wiring is formed,
   wherein:
   one of the LCD devices is electrically connected to the first flexible substrate;
   the other one of the LCD devices is electrically connected to the second flexible substrate;
   the first flexible substrate is electrically connected to the second flexible substrate;
   wherein each of the first and second flexible substrates are located at least partially between the first and second LCD devices; and
   wherein the second flexible substrate is a double-sided wiring substrate having wiring formed on both sides thereof, so that the first flexible substrate is electrically connected to one side of the double-sided wiring substrate and the other one of the LCD devices is electrically connected to the other side of the double-sided wiring substrate.

2. A liquid crystal module comprising:
   at least two liquid crystal display (LCD) devices formed separately from each other;
   a first flexible substrate on which a semiconductor chip for driving the LCD devices is mounted; and
   a second flexible substrate where signal transmission wiring is formed,
   wherein:
   one of the LCD devices is electrically connected to the first flexible substrate;
   the other one of the LCD devices is electrically connected to the second flexible substrate;
   the first flexible substrate is electrically connected to the second flexible substrate;
   the first flexible substrate is formed of a single-sided wiring substrate having wiring formed on one side thereof;
   the second flexible substrate is formed of a double-sided wiring substrate having wiring formed on both sides thereof;
   the first flexible substrate is electrically connected to one side of the second flexible substrate; and
   the other one of the LCD devices is electrically connected to the other side of the second flexible substrate.

3. A liquid crystal module comprising:
   at least two liquid crystal display (LCD) devices formed separately from each other;
   a first flexible substrate on which a semiconductor chip for driving the LCD devices is mounted; and
   a second flexible substrate where signal transmission wiring is formed,
   wherein:
   one of the LCD devices is electrically connected to the first flexible substrate;
   the other one of the LCD devices is electrically connected to the second flexible substrate;
   the first flexible substrate is electrically connected to the second flexible substrate;
   the first flexible substrate is formed of a double-sided wiring substrate having wiring formed on both sides thereof;
   the second flexible substrate is formed of a single-sided wiring substrate having wiring formed on one side thereof;
   one of the LCD devices is electrically connected to one side of the first flexible substrate; and
   the second flexible substrate is electrically connected to the other side of the first flexible substrate.

4. A liquid crystal module of claim 1, wherein:
   a LCD-device connection portion for connecting with one of the LCD devices is provided at one edge portion of the first flexible substrate; and
   a power connection portion to which a power supply line for supplying the power to the semiconductor chip is electrically connected is provided at the other edge portion of the first flexible substrate.

5. A liquid crystal module comprising:
   at least two liquid crystal display (LCD) devices formed separately from each other, each of the two liquid crystal display devices comprising first and second spaced apart glass substrates sandwiching liquid crystal material therebetween; and
   a first flexible substrate on which a semiconductor chip for driving the LCD devices is mounted, a second flexible substrate;
wherein:
one of the LCD devices and the other one of the LCD devices are separately disposed with the first flexible substrate interposed therebetween and are electrically connected together in individual edge portions thereof;
each of the first and second flexible substrates are located at least partially between the first and second LCD devices;
wherein the second flexible substrate is a double-sided wiring substrate having wiring formed on both sides thereof, and wherein the first flexible substrate is electrically connected to one side of the double-sided wiring substrate and one of the LCD devices is electrically connected to the other side of the double-sided wiring substrate; and
a power connection portion to which a power supply line for supplying the power to the semiconductor chip is electrically connected is provided in any one of the edge portions of the first flexible substrate.

6. The liquid crystal module of claim 1, wherein the semiconductor chip for driving the LCD devices is mounted between the first and second LCD devices.

* * * * *